United States Patent [19]

Kanada et al.

[11] 4,297,430

[45] Oct. 27, 1981

[54] PHOTOGRAPHIC MATERIAL FOR PRODUCTION OF PRINTING PLATES AND METHOD FOR PRODUCTION OF PRINTING PLATES

[75] Inventors: Eiji Kanada; Shoji Yamada; Yasuo Tsubai, all of Nagaokakyo, Japan

[73] Assignee: Mitsubishi Paper Mills, Ltd., Tokyo, Japan

[21] Appl. No.: 174,696

[22] Filed: Aug. 1, 1980

Related U.S. Application Data

[63] Continuation-in-part of Ser. No. 142,822, Apr. 22, 1980, abandoned.

[30] Foreign Application Priority Data

May 2, 1979 [JP] Japan .................................. 54/54363

[51] Int. Cl.³ ................................................ G03C 5/54
[52] U.S. Cl. ..................................... 430/204; 430/229; 430/234; 430/246; 430/251; 430/302
[58] Field of Search ............... 430/204, 234, 251, 229, 430/246, 455, 456, 419, 428, 302

[56] References Cited

U.S. PATENT DOCUMENTS

| | | | |
|---|---|---|---|
| 2,857,274 | 10/1958 | Land et al. ........................... | 430/251 |
| 2,857,276 | 10/1958 | Land et al. ........................... | 430/251 |
| 3,681,072 | 8/1972 | Debruyn ............................. | 430/229 |
| 3,894,871 | 7/1975 | Land ................................... | 430/229 |
| 4,147,543 | 4/1979 | Kubotera et al. ................... | 430/204 |

*Primary Examiner*—Mary F. Downey
*Attorney, Agent, or Firm*—Cushman, Darby & Cushman

[57] ABSTRACT

In production of lithographic printing plates by developing a photographic material comprising a support having thereon at least both silver halide emulsion layer and physical development nuclei layer by silver complex diffusion transfer process to form transfer silver to be used as ink-receptive portions of the lithographic printing plates, when the development is carried out in the presence of a cyclic imide compound (alone or in combination with sulfites, thiosulfates, thiocyanates or alkanolamines) as defined hereinafter, ink-receptivity of the transfer silver image portions and printing endurance of thus obtained printing plates are improved. Moreover, the non-image portions have no or substantially no stains.

11 Claims, No Drawings

PHOTOGRAPHIC MATERIAL FOR PRODUCTION OF PRINTING PLATES AND METHOD FOR PRODUCTION OF PRINTING PLATES

REFERENCE TO RELATED APPLICATIONS

This application is a continuation-in-part of application Ser. No. 142,822 filed on Apr. 22, 1980 and now abandoned.

BACKGROUND OF THE INVENTION

This invention relates to a silver halide photographic material for the production of lithographic printing plates by the silver complex diffusion transfer process and a method for making same.

Lithographic printing plates consist of greasy ink receptive olephilic image portions and ink repellent oleophobic non-image portions, the latter being generally water receptive hydrophilic areas.

Therefore, the conventional lithographic printing is carried out by feeding both water and ink to the surface of printing plates to allow the image portions to receive preferentially the ink and the non-image portions to receive preferentially water and then transferring the ink on the image portions onto a substrate such as paper.

Thus, in order to obtain prints of good quality, it is necessary that the difference between oleophilicity of the surface of image portions and hydrophilicity of the surface of non-image portions is sufficiently large so that when water and ink are applied the image portions can receive sufficient amount of ink while the non-image portions may completely repel the ink.

Defects of lithographic printing plates made by silver complex diffusion transfer process (referred to as "DTR process" hereinafter) are as follows. The printing plates are poor in resistance against mechanical abrasion and ink receptivity of hydrophobic areas which carry ink images is gradually lost to result in decrease of printing endurance. Furthermore, the hydrophilic areas are gradually rendered hydrophobic and so the non-image areas, namely, background areas are apt to be stained with ink. Moreover, the hydrophobic image areas become unable to receive uniformly the greasy ink to cause unevenness of ink receptivity of the image areas.

There have already been printing plates in actual use which are produced by providing metallic silver patterns on the plates which are rendered ink-receptive. See, for example, U.S. Pat. No. 3,220,837 and No. 3,721,559, Japanese Patent Examined Publications (KOKOKU) No. 16725/73 and No. 30562/73 and Japanese Patent Unexamined Publications (KOKAI) No. 4482/71 and No. 21602/78. However, these printing plates have still the defects as enumerated above.

Like other lithographic printing plates, lithographic printing plates obtained by applying the DTR process are also required to be increased in their printing endurance by selecting construction of plate materials, composition of processing solutions, printing conditions, etc., but the effect which the state of transfer-developed silver particles give on printing characteristics of printing plates is a big factor for increasing the printing endurance. In order that the silver particles transfer-developed by the DTR process may have higher printing endurance, conditions for formation of transfer silver particles, such as diffusion speed of silver complex, stability and reducing rate and size and shape of the formed silver particles are important factors although construction of lithographic printing plates has some influence thereon.

A great number of compounds are known as silver complex forming agents used for DTR process. For making lithographic printing plates by applying DTR process, thiosulfates and thiocyanates have been considered most preferred and actually used from the economical point of view and the point of printing endurance of said transfer-developed silver particles. However, even these silver complex forming agents cannot provide lithographic printing plates having satisfactory printing endurance.

SUMMARY OF THE INVENTION

Objects of this invention are to provide lithographic printing plates which utilize a DTR process and which have transfer silver image areas excellent in ink receptivity and stainless non-image areas and have improved printing endurance, (namely, said characteristics of the plates can be maintained for a greater number of printings); processing liquid used for making the lithographic printing plates; method for making such printing plates; and photographic materials used for producing such printing plates.

The above objects are realized by using cyclic imides compounds as silver halide complex forming agents in making lithographic printing plates from materials having at least both silver halide emulsion layer and physical development nuclei layer on a support by DTR development. In order to utilize the cyclic imide compounds as silver complex forming agent, they can be located so that the cyclic imide compounds and silver halide may form a soluble silver complex. That is, as nutually understood, the cyclic imide compounds are allowed to exist in silver halide photographic materials and/or DTR developing solutions used for production of lithographic printing plates by the DTR process.

DESCRIPTION OF THE INVENTION

As mentioned hereinbefore, many silver halide solvents are known and cyclic imide compounds are also known as silver halide complex forming agents, see, e.g., U.S. Pat. No. 2,857,276.

It has been found that when lithographic printing plates are produced using DTR process with use of the cyclic imide compounds, the resultant transfer silver has satisfactory ink receptivity and printing endurance.

Another important feature of this invention resides in construction of lithographic printing plates. That is, the object of this invention cannot be attained with lighographic printing plates obtained by imagewise exposing a silver halide emulsion layer-carrying material, bringing it into contact with a physical developing nuclei layer-bearing material and DTR developing the latent images as disclosed in Japanese Patent Unexamined Publication (KOKAI) No. 4482/71 and Japanese Patent Examined Publication (KOKOKU) No. 16725/73. Most of thus obtained printing plates do not have ink receptivity. On the other hand, it has been found that the object of this invention is attained when it is applied to lithographic printing plates comprising a support which bears at least both silver halide emulsion layer and physical developing nuclei layer as disclosed in Japanese Patent Unexamined Publication (KOKAI) No. 21602/78.

A very thin water permeable intermediate layer may be optionally provided between the emulsion layer and the nuclei layer, but preferably the emulsion layer and the nuclei layer are adjacent to each other. The nuclei layer may not contain hydrophilic colloid materials and if it is contained, the thickness of this layer is suitably less than about 1μ, preferably less than 0.5μ. This thickness is not limitative, but is one of the important factors in this invention.

The cyclic imide compounds used in this invention are represented by the following general formula.

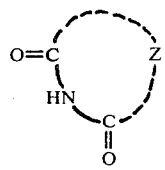

wherein Z represents atoms of a series completing a 5- or 6-membered cyclic imide nucleus which comprises from 1 to 3 nitrogen atoms and the remainder being carbon atoms and said atoms of a series may have substituent(s). Although the foregoing formula is in keto form, it is naturally intended to encompass the enolic modifications of compounds within its scope.

Examples of the substituents which attach to the atoms represented by Z are hydrogen atoms, amino radicals, aliphatic radicals containing from 1 to 4 carbon atoms, halogen atoms, keto oxygen

aromatic radicals, etc.

Typical preferred examples of the cyclic imides are as follows:

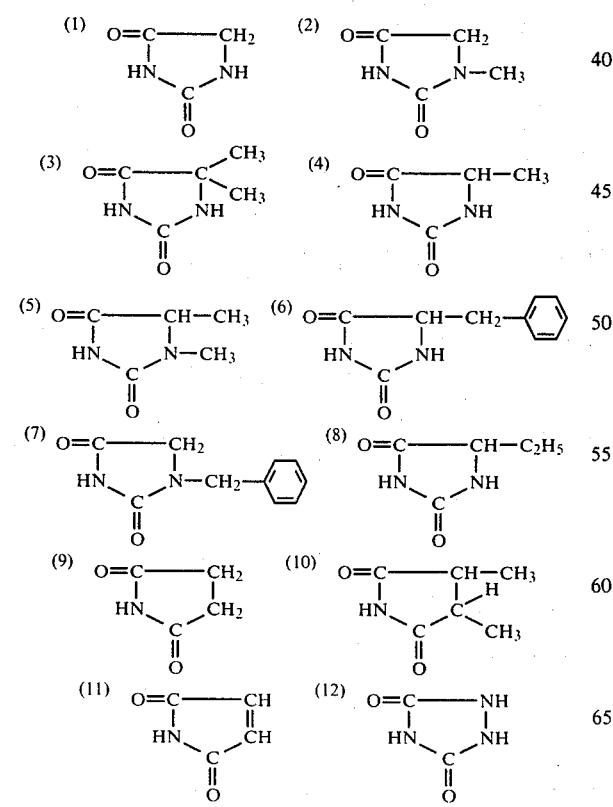

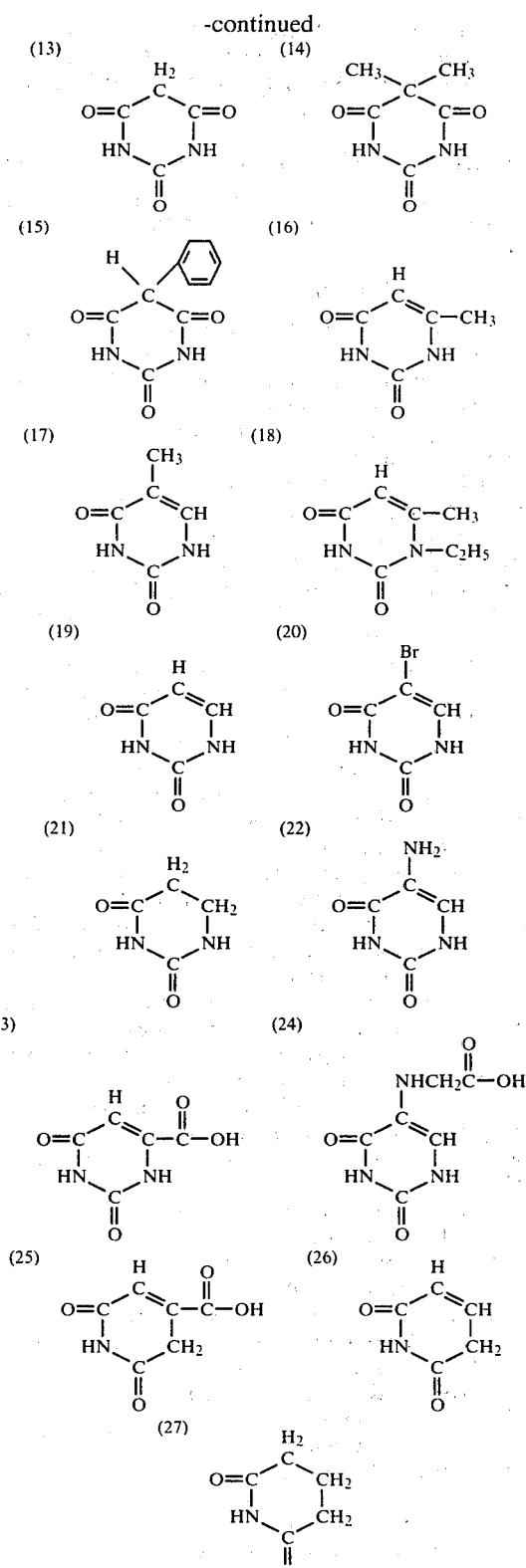

These cyclic imide compounds may be contained in silver halide photographic materials (printing plate materials) for the preparation of lithographic printing plates by adding in an amount of about 0.001–1 g/m² in the form of solutions in water or water-miscible organic solvents. Furthermore, they may be contained in DTR developing solution in an amount of about 0.1–30 g/l. These amounts are not critical and may vary within a certain range depending on various conditions.

Preferable results are obtained when the cyclic imide compounds are contained in printing plate materials.

When they are contained in DTR developing solution, a 5,5-dialkylhydantoin such as compound (3) exemplified above is especially preferred and the preferability of this compound is conspicuous after the lapse of time from preparation of the developing solution.

When cyclic imide compounds are contained in printing plate materials, they may be incorporated into at least one of physical developing nuclei layer, silver halide emulsion layer and other layers.

According to a preferred embodiment of this invention, DTR development is carried out in the coexistence of said cyclic imide compounds and silver halide solvents other than cyclic imide compounds, e.g., thiosulfates, thiocyanates, sulfites, amines (such as alkanol amines and the like) to obtain more satisfactory results than the best results obtained by using said compounds alone.

Alkanolamines which may be suitably used with cyclic imide compounds are preferably represented by the following general formula

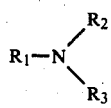

[wherein $R_1$ represents a hydroxyalkyl radical of 2–6 carbon atoms and $R_2$ and $R_3$ which may be identical or different represent hydrogen atom, hydroxyalkyl radical of 2–6 carbon atoms, benzyl radical, alkyl radical of 1–6 carbon atoms and

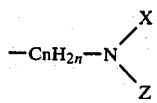

radical (wherein n is an integer of 1–6, and each X and Z is hydrogen atom, alkyl radical of 1–6 carbon atoms and hydroxyalkyl radical of 2–6 carbon atoms)].

Examples of these alkanol amines are ethanolamine, diethanolamine, triethanolamine, diisopropanolamine, 2-methylaminoethanol, 2-ethylaminoethanol, 2-dimethylaminoethanol 2-diethylaminoethanol, 2-methyl-2-amino-1-propanol, 1-diethylamino-2-propanol, 3-diethylamino-1-propanol, isopropylaminoethanol, 3-amino-1-propanol, 2-methyl-2-amino-1,3-propanediol, benzyldiethanolamine, 2-(hydroxymethyl)-2-amino-1,3-propanediol, etc.

The alkanolamines may be used in printing plate layers and/or DTR developing solution, but preferably is contained in the latter because they are volatile.

Generally, they may be used in an amount of about 5 g—about 100 g, preferably about 5 g—about 60 g per 1 l of the developing solutions.

Thiosulfates and thiocyanates which can be used in this invention may be contained in an amount of about 0.05–about 30 g/l in DTR developing solutions.

Moreover, sulfites which can be used in this invention may be contained in an amount of about 10–about 100 g/l in DTR developing solutions.

The silver halide emulsion for use in this invention can be any of the photographic emulsions such as those of chloride, bromide, chlorobromide, chloroiodide, bromoiodide, and chlorobromoiodide of silver and the most preferred is that containing at least about 50 mol% of silver chloride. Size, crystal habit and distribution of the silver halide grains are not limitative. Moreover, the silver halide emulsions can be prepared by any methods usually known in the photographic field. The silver halide emulsions may be chemically sensitized by well-known methods and also may be spectral-sensitized for blue, green and red. Antifoggants, stabilizers, developing agents, hardeners, matting agents (graining agents) may also be added. Preferred binder for the silver halide emulsion is gelatin, a part or whole of which may be substituted with other natural and/or synthetic hydrophilic colloid such as albumin, casein, polyvinyl alcohol, sodium alginate, sodium salt of carboxymethylcellulose, etc.

Weight ratio of the hydrophilic colloid to silver halide in terms of silver nitrate is generally 5–0.3, preferably 2–0.5.

Amount of silver halide coated on a support is about 0.2–5 g/m², preferably 0.5–3 g/m² in terms of silver nitrate.

Undercoat layers may be provided under the silver halide emulsion layers (and above the support) for purpose of antihalation. As the support may be used any conventional supports for photographic materials such as paper, glass, films such as cellulose acetate film, polyvinyl acetal film, polystyrene film, polypropylene film, polyethylene terephthalate film, composite films such as polyester, polypropylene, polystyrene films covered with polyethylene films, metals, metallized papers or metal/paper laminates. Papers one or both surfaces of which are coated with an α-olefin polymer such as polyethylene are also effective. These supports may contain antihalation dyes or pigments. If necessary, a thin layer of water-permeable binders such as methylcellulose, sodium salt of carboxymethylcellulose, hydroxyethylcellulose, hydroxyethyl starch, sodium alginate, polyvinyl alcohol, polyvinylpyrrolidone may be provided as an uppermost layer on the emulsion coated side of the support.

In practice of the DTR process the developer may be incorporated into silver halide emulsion layer and/or image receiving layer or other water-permeable layers adjacent thereto as disclosed in British Patents No. 1,000,115, No. 1,012,476, No. 1,017,273, No. 1,042,477, etc. Therefore, in this case, as the processing solution used at developing stage the so-called "alkaline activating solution" containing no developer may be used.

The physical development nuclei layer, namely, an image receiving layer which is preferably adjacent to the silver halide emulsion layer may be provided above or under the silver halide emulsion layer, but preferably it is provided above it (i.e., not between the support and the emulsion layer).

Suitable physical development nuclei used in this invention are metals such as antimony, bismuth, cadmium, cobalt, palladium, nickel, silver, lead, zinc, etc. and their sulfides. The image receiving layer may not contain hydrophilic colloid, but may contain hydrophilic colloids such as gelatin, carboxymethylcellulose, gum arabic, sodium alginate, hydroxyethyl starch, dextrin, hydroxyethylcellulose, polystyrenesulfonic acid, vinylimidazole-acrylamide copolymer, polyvinyl alcohol, etc.

The image receiving layer may contain wetting agents such as hygroscopic materials, e.g., sorbitol, glycerol, etc. The image receiving layer may further contain pigments for preventing scumming such as barium sulfate, titanium dioxide, china clay, silver, etc., developing agents such as hydroquinone and hardeners such as formaldehyde.

The DTR processing solution used in this invention may contain alkaline materials such as sodium hydroxide, potassium hydroxide, lithium hydroxide, trisodium phosphate, etc., thickeners such as hydroxyethylcellulose, carboxymethylcellulose, etc., anti-foggants such as potassium bromide, 1-phenyl-5-mercaptoterazole, etc., developers such as hydroquinone, 1-phenyl-3-pyrazolidone, etc., development modifiers such as polyoxyalkylene compounds, onium compounds, etc.

The lithographic printing plates according to this invention may be made ink-receptive or ink-receptivity may be increased with compounds as disclosed in Japanese Patent Publication No. 29723/73 and U.S. Pat. No. 3,721,559.

The conventional printing method, etch solutions, damping solutions, etc. may be used for carrying out printing with the lithographic printing plates of this invention.

The following nonlimiting examples further illustrate this invention.

EXAMPLE 1

A matting layer containing silica particles of 5μ in average particle size was provided on one surface of a both surfaces polyethylene coated paper of 135 g/m². On another surface of said paper which had been subjected to corona discharge treatment was provided an antihalation layer containing carbon black and then on this layer was coated an orthochromatically sensitized high speed silver chlorobromide emulsion (containing 95 mol% of silver chloride) containing silica particles of 5μ in average particle size at a coating amount of 2.0 g/m² in terms of silver nitrate. These antihalation layer and emulsion layer contained formalin as a hardener. After drying, this material was left for 3 days at 40° C. and then on said emulsion layer was coated a palladium sulfide sol prepared by the following process at a rate of 5 m/min.

Preparation of the palladium sulfide sol

| Liquid A | Palladium chloride | 5 g |
| | Hydrochloric acid | 40 ml |
| | Water | 1 l |
| Liquid B | Sodium sulfide | 8.6 g |
| | Water | 1 l |

Liquid A and liquid B were mixed with stirring. After 30 minutes, the resultant mixture was purified by passing it through a column packed with ion-exchange resin made for preparation of pure water and then the following liquid C was added thereto to obtain a coating liquid.

| Liquid C | Methylvinyl ether/maleic anhydride copolymer (1.25%) | 100 ml |
| | 10% aqueous solution of saponin | 200 ml |
| | Water | 1.8 l |

Thus obtained lithographic printing plate material was exposed imagewise in a camera for letterpress having an image reverse mechanism and was developed with the following silver complex diffusion tranfer developing solution A at 30° C. for one minute.

Transfer developing solution A

| Water | 750 ml |
| Sodium hydroxide | 10 g |
| Anhydrous sodium sulfite | 50 g |
| Hydroquinone | 6 g |
| Phenidone | 0.5 g |
| Sodium thiosulfate (5H₂O) | 5 g |
| Exemplified compound (3) | 5 g |
| Water to make 1 l | |

Thereafter, this lithographic printing plate material was passed between two squeezing rollers to remove excess developing solution and immediately thereafter was treated with a neutralizing solution having the following composition at 25° C. for 20 seconds. Then, excess solution was removed by squeezing rollers and the material was dried at room temperature.

Neutralizing solution

| Water | 600 ml |
| Citric acid | 10 g |
| Sodium citrate | 35 g |
| Colloidal silica (20% liquid) | 5 ml |
| Ethylene glycol | 5 ml |
| Water to make 1 l | |

Thus produced lithographic printing plate was mounted on an offset printing machine, the following etch solution was applied all over the plate surface and printing was carried out using the following damping solution.

Etch solution

| Water | 600 ml |
| Isopropyl alcohol | 400 ml |
| Ethylene glycol | 50 g |
| 3-Mercapto-4-acetamide-5-n-heptyl-1,2,4-triazole | 1 g |

Damping solution

| o-Phosphoric acid | 10 g |
| Nickel nitrate | 5 g |
| Sodium nitrite | 5 g |
| Ethylene glycol | 100 g |
| Colloidal silica (20% liquid) | 28 g |
| Water to make 2 l | |

From the start of printing this printing plate had excellent ink receptivity and a great many clear printed copies with no stains were obtained.

EXAMPLE 2

Lithographic printing plates were produced in the same manner as Example 1 except that 1.0 g/m² of hydroquinone and 0.5 g/m² of 1-phenyl-3-pyrazolidone were incorporated into the silver halide emulsion layer of Example 1 and the following transfer developing solution B and the same developing solution B to which each of the cyclic imide compounds (1), (3), (4), (5), (6), (8), (9), (13), (14), (17), (19) and (20) exemplified hereinbefore was added in an amount of 10 g/l were used in place of transfer developing solution A. Printing was carried out using thus obtained printing plates in the same manner as in Example 1.

Transfer developing solution B

| Water | 800 ml |
|---|---|
| Trisodium phosphate | 75 g |
| Anhydrous sodium sulfite | 50 g |
| Potassium bromide | 0.5 g |
| Sodium thiosulfate | 15 g |
| Water to make 1 l | |

The results were as follows: The printing plate produced using the developing solution B containing no cyclic imide compound could stand printing of at most about 2,500 copies while the printing plates produced using the developing solution B containing the cyclic limide compounds could stand printing of more than 5,000 copies. Furthermore, printing was carried out using printing plates obtained with the above developing solutions which were left for one week at room temperature after preparation. In this case, the printing plate produced with the developing solution containing the cyclic imide compound (3) had substantially the same printing endurance while other printing plates could stand printing of 2,000–4,000 copies.

EXAMPLE 3

The procedure of Example 2 was repeated using the developing solution B which contained the cyclic imide compound (3) and in which contents of sodium thiosulfate and the cyclic imide compound (3) were varied as shown in the following Table 1.

Evaluation of the printing endurance was effected as follows in this invention:

Printing of at least 5,000 copies was carried out with the printing plates and printing endurance of these plates was expressed by the maximum number of copies which could be obtained with no poor sticking of ink onto image portions or no stains of white background portions.

TABLE 1

| g/l | No. | | | | | | | | | |
|---|---|---|---|---|---|---|---|---|---|---|
| | 1 | 2 | 3 | 4 | 5 | 6 | 7 | 8 | 9 | 10 |
| Sodium thiosulfate | 1 | 5 | 10 | 20 | — | — | 1 | 1 | 5 | 5 |
| Cyclic imide compound (3) | — | — | — | — | 5 | 10 | 5 | 10 | 5 | 10 |
| Printing endurance | 2,500 | 2,500 | 3,000 | 3,000 | 3,000 | 3,000 | more than 5,000 | | | |

EXAMPLE 4

Lithographic printing plates were produced in the same manner as Example 2 except that each of the cyclic imide compounds used in Example 2 was incorporated in an amount of 0.5 g/m² into the image receiving layer and that the following transfer developing solution C was used in place of developing solution B.

Transfer developing solution C

| Trisodium phosphate | 75 g |
|---|---|
| Anhydrous sodium sulfite | 50 g |
| Potassium bromide | 0.5 g |
| 2-Amino-2-methyl-1-propanol | 10 g |
| Water to make 1 l | |

More than 5,000 copies could be printed with thus obtained lithographic printing plate as in Example 2.

What is claimed is:

1. A method for producing a lithographic printing plate which comprises developing a photographic material exposed to light comprising a support having thereon at least both silver halide emulsion layer and surface physical development nuclei layer and having a thickness of 0.5µ or less by silver complex diffusion transfer process and utilizing transfer silver as ink receptive portions of printing plate, characterized in that the development is carried out in the presence of a cyclic imide compound having the general formula:

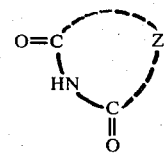

(wherein Z represents atoms of a series of completing a 5- or 6-membered cyclic imide nucleus which comprises from 1 to 3 nitrogen atoms and the remainder being carbon atoms and said atoms of Z may have substituent).

2. A method for producing a lithographic printing plate according to claim 1, wherein the cyclic imide compound is present in at least one layer of the photographic material.

3. A method for producing a lithographic printing plate according to claim 1, wherein the cyclic imide compound is present in a diffusion transfer developing solution.

4. A method for producing a lithographic printing plate according to claim 1, wherein the development is carried out in the presence of said cyclic imide compound and a sulfite.

5. A method for producing a lithographic printing plate according to claim 1, wherein the development is carried out in the presence of said cyclic imide compound and a silver halide solvent selected from thiosulfates and thiocyanates.

6. A method for producing a lithographic printing plate according to claim 1, wherein the development is carried out in the presence of said cyclic imide compound and an alkanolamine.

7. Lithographic printing plate which comprises a support having thereon at least both silver halide emulsion layer and surface physical development nuclei layer having a thickness of 0.5µ or less and which is developed by silver complex diffusion transfer process to form transfer silver to be used as ink-receptive portions, characterized in that at least one layer contains a cyclic imide compound having the following general formula:

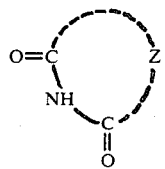

(wherein Z represent atoms of a series completing a 5- or 6-membered cyclic imide nucleus which comprises from 1 to 3 nitrogen atoms and the remainder being carbon atoms and said atoms of Z may have substituent).

8. A lithographic plate according to claim 7, wherein the silver halide emulsion layer and the physical development nuclei layer are adjacent to each other.

9. A method for producing a lithographic printing plate according to claim 4, wherein the sulfite is present in the developing solution.

10. A method for producing a lithographic printing plate according to claim 5, wherein the thiosulfate or thiocyanate is present in the developing solution.

11. A method for producing a lithographic printing plate according to claim 6, wherein the alkanolamine is present in the developing solution.

* * * * *